United States Patent [19]
Gray, III et al.

[11] Patent Number: 6,026,963
[45] Date of Patent: *Feb. 22, 2000

[54] MOISTURE BARRIER BAG HAVING WINDOW

[75] Inventors: Aaron Leo Gray, III, St. Charles; Elizabeth C. Cooke, Chesterfield, both of Mo.

[73] Assignee: MEMC Electronic Materials, Inc., St. Peters, Mo.

[ * ] Notice: Under 35 U.S.C. 154(b), the term of this patent shall be extended for 150 days.

[21] Appl. No.: 08/604,813

[22] Filed: Feb. 23, 1996

[51] Int. Cl.$^7$ ................................................ B65D 85/48
[52] U.S. Cl. .......................... 206/710; 206/778; 383/106
[58] Field of Search ..................................... 206/710–720, 206/832, 775, 776, 778; 383/106, 122, 121, 124.1, 104

[56] References Cited

U.S. PATENT DOCUMENTS

| | | | |
|---|---|---|---|
| 2,177,894 | 10/1939 | Lakso ........................................ | 383/106 |
| 2,298,421 | 10/1942 | Salfisberg ................................. | 383/106 |
| 2,334,410 | 11/1943 | Hume ........................................ | 383/121 |
| 3,121,452 | 2/1964 | Hyman ...................................... | 383/106 |
| 3,409,063 | 11/1968 | Pokras ...................................... | 383/122 |
| 4,971,196 | 11/1990 | Kitamura et al. . | |
| 5,095,626 | 3/1992 | Kitamura et al. ........................ | 206/720 |
| 5,293,996 | 3/1994 | Duncan . | |

FOREIGN PATENT DOCUMENTS

| | | | |
|---|---|---|---|
| 0 159 416 A2 | 10/1985 | European Pat. Off. . | |
| 0 512 579 A1 | 11/1992 | European Pat. Off. . | |
| 1362573 | 4/1964 | France ..................................... | 383/106 |
| 2 436 719 | 4/1980 | France . | |
| 3907291 | 9/1990 | Germany ................................ | 383/106 |

OTHER PUBLICATIONS

Japanese Abstract, Publication No. 02180181 (Mitsubishi Electric Corp.), Jul. 13, 1990.

*Primary Examiner*—Paul T. Sewell
*Assistant Examiner*—Luan K. Bui
*Attorney, Agent, or Firm*—Senniger, Powers, Leavitt & Roedel

[57] ABSTRACT

A moisture barrier bag for containing semiconductor wafers. The bag includes at least one opaque panel made of moisture barrier material, and at least one window panel made of at least partially transparent material. The window panel is joined in sealing relation to the opaque panel. The opaque panel and window panel are capable of defining a volume for receiving semiconductor wafers therein. The window panel permits optical inspection of semiconductor wafers received within the volume. The moisture barrier material has a moisture transmission rate which is sufficiently small to permit storage of semiconductor wafers within the volume for an extended period of time without damaging the wafers by moisture attack.

13 Claims, 3 Drawing Sheets

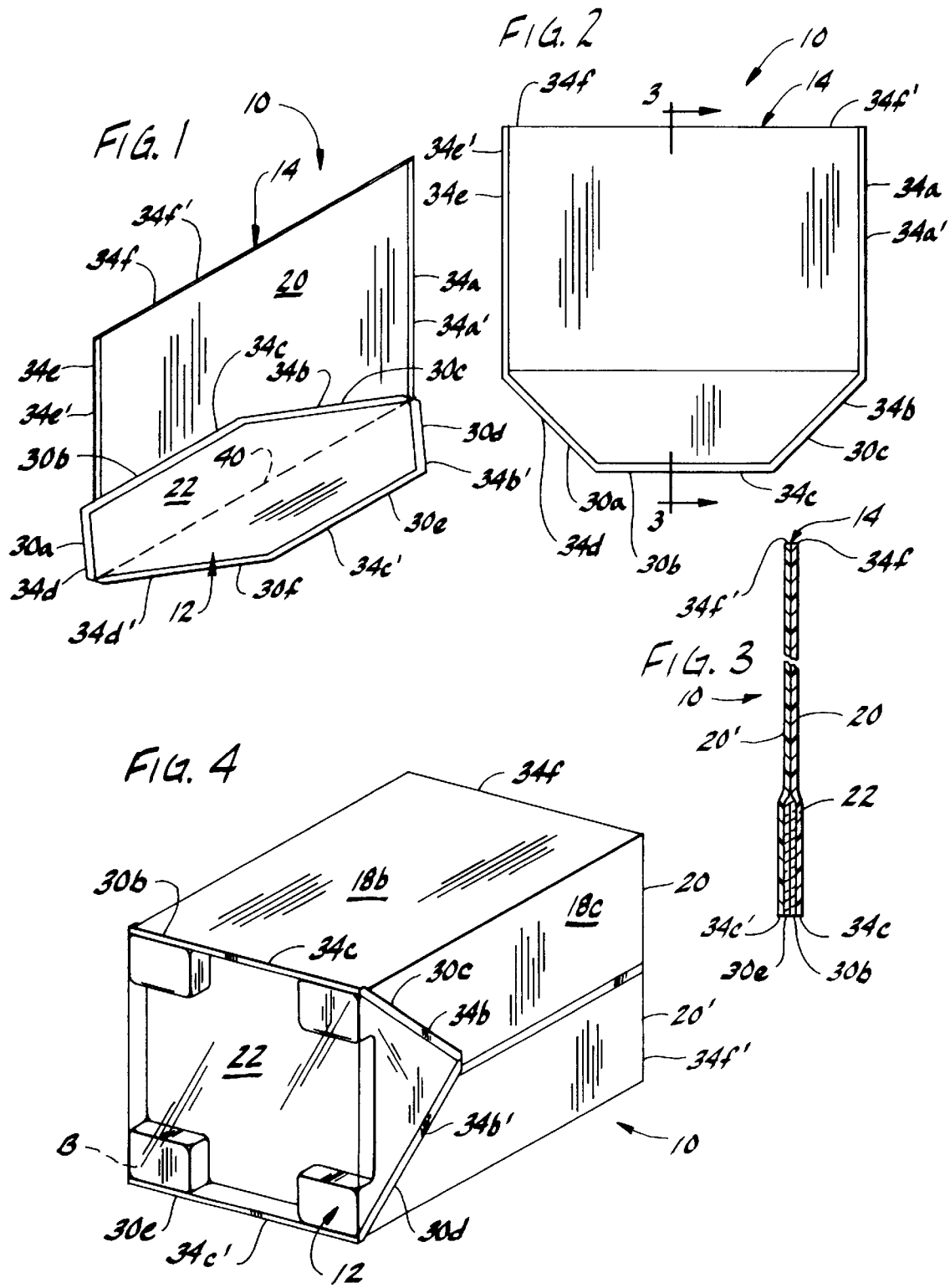

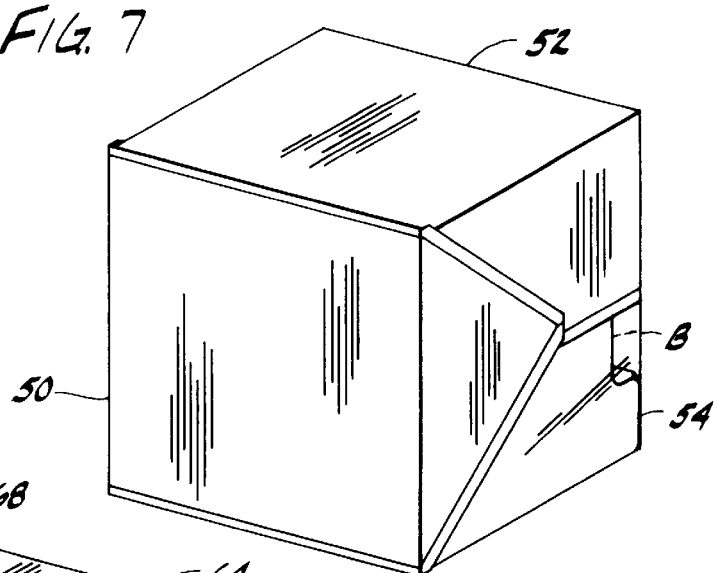
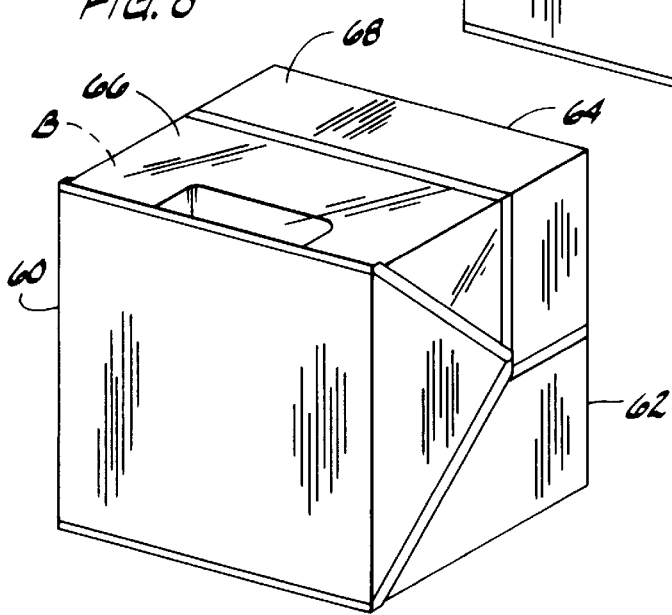
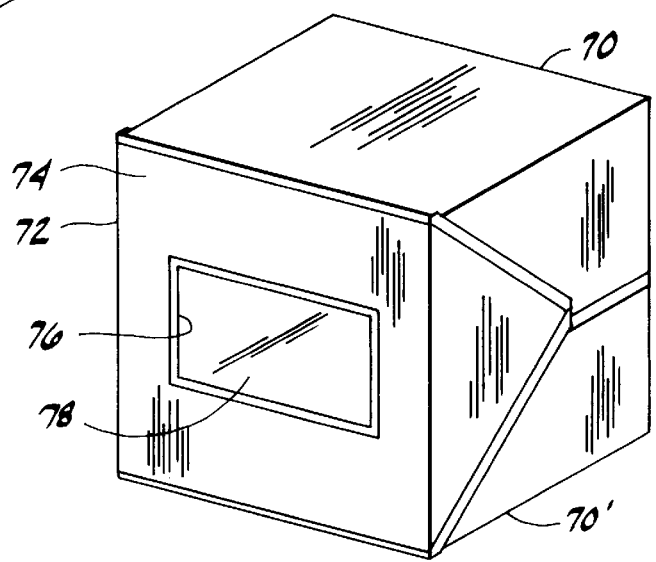

MOISTURE BARRIER BAG HAVING WINDOW

BACKGROUND OF THE INVENTION

This invention relates generally to moisture barrier bags of the type used to transport and store semiconductor wafers, and more particularly to a bag having a window for optically inspecting wafers contained in the bag.

Semiconductor wafers such as those used in various electronics applications may be damaged if contacted by moisture because water chemically attacks semiconductor materials. To inhibit moisture contact, semiconductor wafers are usually stored and transported in some type of moisture barrier. Typically, the moisture barriers are flexible bags which are sealed around transparent boxes containing transparent cassettes which hold several wafers vertically on edge. Thus, the cassettes prevent the wafers from contacting each other, the boxes prevent contact with external objects, and the bags prevent contact with moisture. In the past, the moisture barrier bags were made entirely of low cost materials having ultra-low moisture transmission rates. One such material is an opaque laminate made by vapor depositing aluminum on clear acrylar polymer sheet. Because the laminate is opaque, technicians and machines are unable to optically inspect the contents of the bags. Therefore, the type and number of wafers contained in an opaque bag cannot be confirmed without opening it. However, opening the bag may introduce moisture into the bag thereby defeating its purpose. Moreover, bags made entirely of transparent materials have proved unsatisfactory because they typically have higher moisture transmission rates and cost more than bags made of opaque materials.

SUMMARY OF THE INVENTION

Among the several objects of this invention may be noted the provision of a semiconductor wafer moisture barrier bag having a window for optically inspecting the contents of the bag without significantly increasing either moisture transmission or cost; the provision of such a bag which folds flat for compact storage when not in use; the provision of such a bag having a panel which is entirely optically transparent; the provision of such a bag having an optically transparent panel at a closed end; the provision of such a bag having a shape similar to prior art bags so that it does not necessitate changes in manufacturing; and the provision of such a bag having a closed end which conforms to the shape a semiconductor wafer box thereby reducing material, improving appearance and minimizing the amount of air trapped in the bag around the semiconductor wafers.

Briefly, apparatus of this invention is a moisture barrier bag for containing semiconductor wafers. The bag includes at least one opaque panel made of moisture barrier material, and at least one window panel made of at least partially transparent material. The window panel is joined in sealing relation to the opaque panel. The opaque panel and window panel are capable of defining a volume for receiving semiconductor wafers therein. The window panel permits optical inspection of semiconductor wafers received within the volume. The moisture barrier material has a moisture transmission rate which is sufficiently small to permit storage of semiconductor wafers within the volume for an extended period of time without damaging the wafers by moisture attack.

In another aspect of this invention, the apparatus comprises a moisture barrier bag for containing semiconductor wafers. The bag comprises panel means made of opaque, moisture barrier material, and a window panel of at least partially transparent material. The panel means has at least one pair of opposing side edge margins joined together in face-to-face, sealing relation, and at least one pair of generally opposing end edge margins which are not joined together. The window panel has edge margins which are joined to the pair of opposing end edge margins which are not joined together. The panel means and window panel are capable of defining a volume for receiving semiconductor wafers in the volume whereby semiconductor wafers received in the volume may be optically inspected through the window panel.

Other objects and features of this invention will be in part apparent and in part pointed out hereinafter.

BRIEF DESCRIPTION OF THE DRAWINGS

FIG. 1 is a front perspective of a bag of the present invention shown flattened except for a transparent, closed end of the bag which is unfolded;

FIG. 2 is a front elevation of the bag shown with the closed end folded so that the entire bag is flattened;

FIG. 3 is a fragmentary cross section of the bag taken in the plane of line 3—3 of FIG. 2;

FIG. 4 is a front perspective of the bag with a wafer storage box contained within an interior volume;

FIG. 7 is a front perspective of the bag showing a second embodiment of the present invention prepared for transport;

FIG. 8 is a front perspective of the bag showing a third embodiment of the present invention prepared for transport; and FIG. 9 is a front perspective of the bag showing a fourth embodiment of the present invention prepared for transport.

Corresponding parts are designated by corresponding reference characters throughout the several views of the drawings.

DETAILED DESCRIPTION OF THE PREFERRED EMBODIMENT

Figure 5:
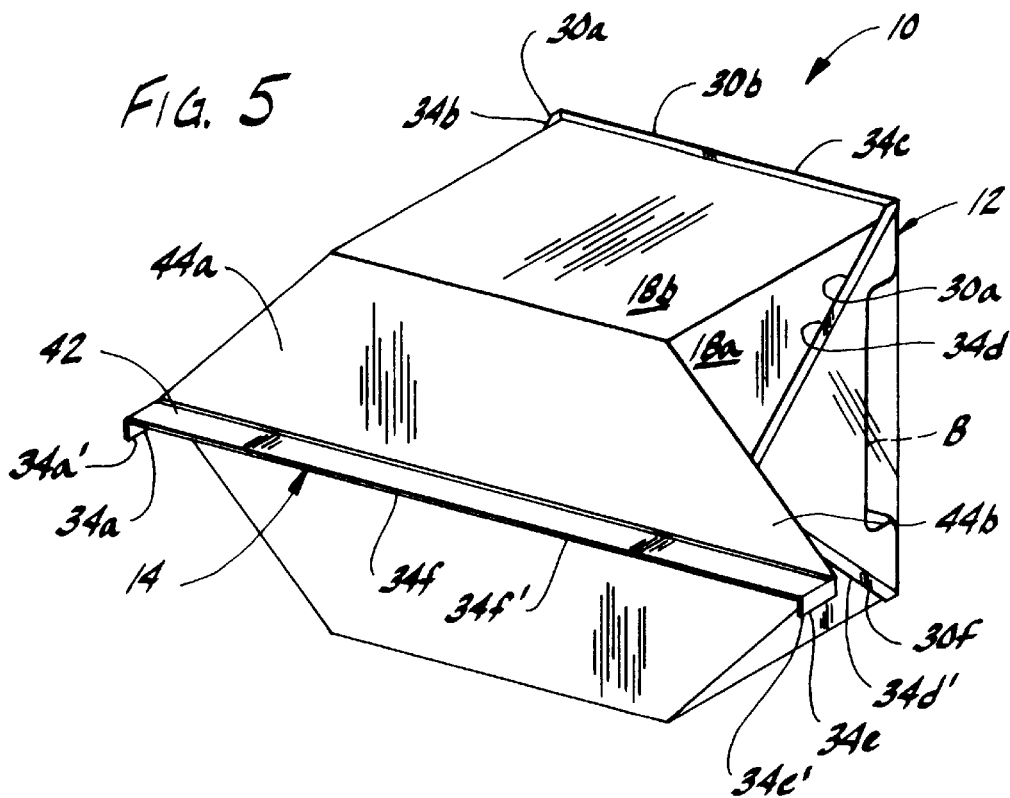
FIG. 5 is a rear perspective of the bag with the wafer storage box sealed within the interior volume.

Referring now to the drawings, and first more particularly to FIG. 1, a moisture barrier bag incorporating the present invention is indicated generally by the reference numeral 10. The bag 10 has a closed end and an opposite, initially open end, designated generally at 12 and 14, respectively. The open end is sized to receive a semiconductor wafer box B (FIG. 4) into the bag 10. The bag 10 is flexible so that it may be flattened to a collapsed position as shown in FIGS. 2 and 3 for compact storage prior to use, or unfolded to an expanded position having an interior volume as shown in FIG. 4. The interior volume is a rectangular parallelepiped defined by four generally rectangular side walls (only three of which are visible in FIGS. 4–6, designated 18a–18c) extending between the ends 12, 14 of the bag 10. The semiconductor wafer box B is held within the interior volume when the box is inserted into the bag 10 through the open end 14.

The bag 10 is comprised of opaque panels 20, 20' (broadly, "panel means made of opaque moisture barrier material") and a transparent window panel 22 (FIG. 1). In the preferred embodiment, the bag 10 includes two identical opaque panels 20, 20' (FIG. 3); however, it is envisioned that the bag might be made of a single opaque panel folded over on itself to form a tube, or more than two opaque panels without departing from the scope of the present invention. It is recognized that the number and shape of opaque panels will depend upon the size and shape of the bag needed. In the preferred embodiment, the transparent window panel 22 is made of clear acrylar polymer sheet having a thickness of approximately 0.165 mm and a moisture transmission rate of about 0.005 gm/cm$^2$/day. As with the opaque panels 20, 20', two or more window panels 22 may be included in the bag without departing from the scope of the present invention. The opaque panels 20, 20' are made of a laminate formed by vapor depositing one or more layers of aluminum on clear acrylar polymer sheet. The laminate used in the opaque panels 20, 20' has a thickness of approximately 0.140 mm and a moisture transmission rate of less than about 0.0006 gm/cm$^2$/day.

Thus, by minimizing the size of the transparent window panel 22, the overall moisture transmission rate of the bag 10 is minimized. Further, because the material cost of the clear polymer sheet is approximately twice that of the opaque material, minimizing the size of the transparent window panel 22 also minimizes the overall material cost of the bag 10. Nonetheless, a sufficient amount of transparent material must be employed in the window panel 22 to permit the box B to be sufficiently viewed when inside the interior volume. Further, because the window panel 22 of the present invention simply replaces the bottom panel of prior art opaque bags, no additional seams are required in the bag 10 over those required in prior art opaque bags. Using a configuration identical to prior art bags eliminates the need for re-tooling the bag manufacturing facility or the semiconductor packaging facility.

The transparent window panel 22 has six edges 30a–30f defining a hexagon having a central rectangular portion and two opposing triangular portions (FIG. 1), one depending from each side of the rectangular portion. As may be seen in FIG. 2, each of the opaque panels 20, 20' has six edges 34a–34f, 34a–34f' defining a rectangular portion, and an adjacent trapezoidal portion at the closed end 12 of the bag 10. The sizes and aspect ratios of the transparent and opaque panels 22, 20, 20' may be adjusted depending upon the size of the semiconductor wafer box B which is intended to be received within the interior volume of the bag 10. Regardless of its finished dimensions, the bag 10 of the preferred embodiment is constructed by joining the opposing side edge margins of the opaque panels to form the panel means. The side edge margins of the opaque panels 20, 20' are joined by heat sealing so that the corresponding opposing side edges are aligned, edge 34a with 34a' and 34e with 34e'. The edge margins of window panel 22 are joined by heat sealing to the end margins of the assembled opaque panels 20, 20' to complete the bag 10. When the window panel margins are joined to the corresponding opaque panel margins, the corresponding edges of each of the panels 22, 20, 20' are aligned (i.e., edge 30a is aligned with edge 34d, 30b with 34c, 30c with 34b, 30d with 34b', 30e with 34c' and 30f with 34d'). The completed bag 10 may be fully collapsed by folding the window panel 22 along a fold line indicated at 40 (FIG. 1) to a flattened position as shown in FIGS. 2 and 3 for compact storage and transport.

Figure 6:
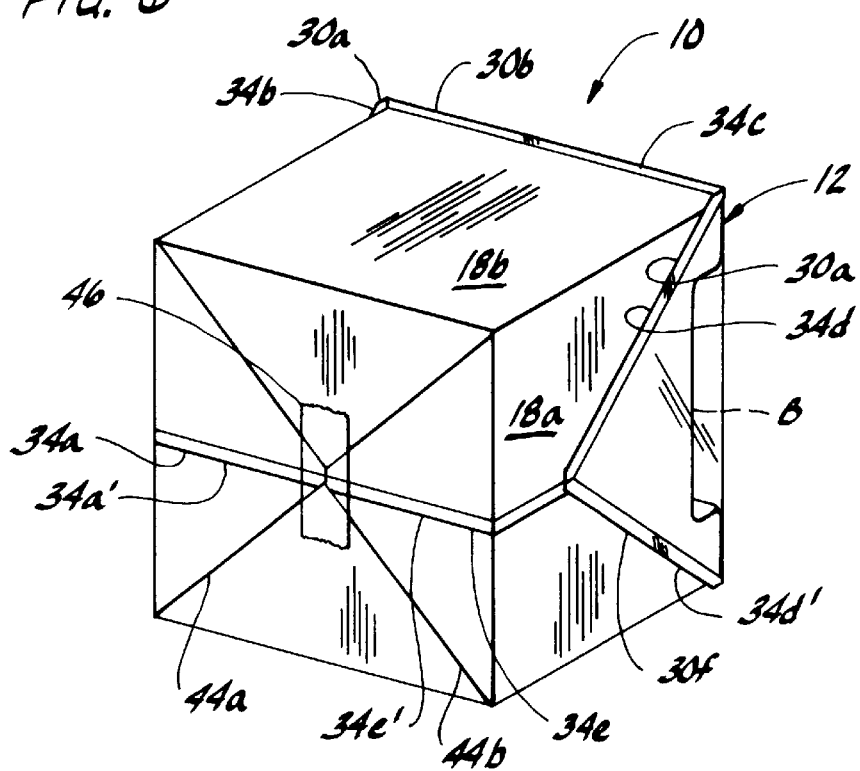
FIG. 6 is a rear perspective of the bag as further prepared for transport.

To use the bag 10, one or more semiconductor wafers (not shown) are placed on edge in a storage cassette (not shown), and the cassette is placed in a semiconductor wafer storage box B. The bag is unfolded to an open position as shown in FIG. 4 and the box B is inserted into the interior volume of the bag through the open end 14. The box B is moved toward the closed end 12 until the box rests against the transparent window panel 22. The window panel 22 conforms to the box so that its rectangular portion overlies one entire end of the box and its opposing triangular portions partially cover two sides of the box which are adjacent the rectangular portion as shown in FIG. 4. Once the box B is in position adjacent the closed end 12 of the bag 10, the opaque panel edges 34f, 34f' are brought together and the open end 14 of the bag 10 is closed by joining the corresponding edge margins as shown in FIG. 5. The edge margins may be sealed by any means such as heat sealing. The seal joining edge margins is preferably positioned as close as practical to the box B to minimize the amount of air trapped within the interior volume around the box B. A tongue 42 and two triangular ears 44a, 44b are formed at the previously open end 14 when the bag 10 is sealed. The tongue 42 may be trimmed if desired. The triangular ears 44a, 44b are folded flat against a rectangular portion of the bag 10 as shown in FIG. 6, and the flattened ears 44a, 44b are attached to the bag 10 with tape 46 to form a compact container for storing and transporting the semiconductor wafers.

Other lesser preferred embodiments of the present invention are shown in FIGS. 7–9. Other than the differences noted below, the bags of the second, third, and fourth embodiments are identical to that of the most preferred embodiment described above. FIG. 7 shows a second embodiment comprising an opaque end panel 50, an opaque side panel 52, and a transparent side panel 54.

FIG. 8 shows a third embodiment comprising an opaque end panel 60, a first entirely opaque side panel 62, and a second partially transparent side panel 64. The partially transparent side panel 64 may be manufactured by attaching a transparent sub-panel 66 to an opaque sub-panel 68. In an alternative third embodiment (not shown), it is envisioned that the partially transparent side panel 64 may be manufactured by vapor depositing aluminum on only part of an initially transparent panel so that the part having aluminum deposited is opaque.

A fourth embodiment shown in FIG. 9 is also envisioned. The fourth embodiment bag comprises two opaque side panels 70, 70', and a partially transparent opaque end panel 72. The end panel 72 includes an opaque sub-panel 74 having a cutout 76. A transparent sub-panel 78 is sealed to the inside of the end panel 72 over the cutout 76. Thus, the partially transparent end panel 72 has a window through which wafers may be viewed. In an alternative fourth embodiment, the end panel may be entirely opaque and the transparent sub-panel may be positioned within a cutout made in one of the side panels.

While the present invention has been described by reference to a specific embodiment, it should be understood that modifications and variations of the invention may be constructed without departing from the scope of the invention defined in the following claims.

What is claimed is:

1. A moisture barrier bag for containing semiconductor wafers, the bag comprising:

two opaque panels made of moisture barrier material, the edge margins of each of said opaque panels including at least one pair of opposing side edge margins and at least one pair of generally opposing end edge margins, the shapes of the two opaque panels are substantially the same and are arranged such that the edge margins of the panels are in generally opposing relation, each of said opposing side edge margins having a segment, said segments of opposing side edge margins being joined together in sealing relation; and at least one window panel made of at least partially transparent material, said window panel having six edges defining a rectangular center portion and opposing triangular portions extending from the center portion, the window panel being joined in sealing relation to said opacue panels, said opaque panels and window panel being capable of defining a volume for receiving semiconductor wafers therein, the window panel permitting optical inspection of semiconductor wafers received within the volume, the moisture barrier material having a moisture transmission rate which is sufficiently small to permit storage of semiconductor wafers within the volume for an extended period of time without damaging the wafers by moisture attack.

2. The moisture barrier bag as set forth in claim 1 wherein each of said opaque panels has six edges defining a rectangular portion and a trapezoidal portion adjacent the rectangular portion.

3. The moisture barrier bag as set forth in claim 2 wherein said window panel rectangular and triangular portions are joined to said opaque panel trapezoidal portion.

4. The moisture barrier bag as set forth in claim 1 wherein said opaque panels and said window panel comprise sheet material and the moisture transmission rate of the material is less than or equal to about 0.005 gm/cm$^2$/day.

5. The moisture barrier bag as set forth in claim 4 wherein the moisture transmission rate of said opaque panel sheet material is less than about 0.0006 gm/cm$^2$/day.

6. A moisture barrier bag as set forth in claim 1 in combination with a plurality of semiconductor wafers sealed within the moisture barrier bag.

7. A moisture barrier bag for containing semiconductor wafers, the bag comprising:

at least one opaque panel made of moisture barrier material, said opaque panel having at least one pair of opposing side edge margins joined together in face-to-face, sealing relation, and at least one pair of generally opposing end edge margins which are not joined together;

a window panel of at least partially transparent material, the window panel having edge margins joined to said one pair of opposing end edge margins which are not joined together, said window panel having six edges defining a rectangular center portion and opposing triangular portions extending from the center portion;

said opacue panel and window panel being capable of defining a volume for receiving semiconductor wafers therein whereby semiconductor wafers received in the volume may be optically inspected through the window panel.

8. The moisture barrier bag as set forth in claim 7 wherein said opaque panel comprises a plurality of panels made of opaque, moisture barrier material.

9. The moisture barrier bag as set forth in claim 8 wherein said opaque panel comprises:

a first panel of opaque, moisture barrier material;

a second panel of opaque, moisture barrier material;

the first and second panels having substantially the same shape and being arranged such that the edge margins of the first panel are in generally opposing relation with corresponding edge margins of the second panel, each of said opposing side edge margins having a segment joined together in sealing relation with a corresponding segment of the opposing side edge margin.

10. The moisture barrier bag as set forth in claim 7 wherein said opaque panel and said window panel comprise sheet material having a moisture transmission rate of less than or equal to about 0.005 gm/cm$^2$/day.

11. The moisture barrier bag as set forth in claim 10 wherein said opaque panel sheet material has a moisture transmission rate of less than about 0.0006 gm/cm$^2$/day.

12. The moisture barrier bag as set forth in claim 7 wherein said opposing triangular portions include edge margins which are joined to at least a segment of the opaque panel side margins and the rectangular center portion include edge margins which are joined to the opaque panel end edge margins.

13. A moisture barrier bag as set forth in claim 7 in combination with a plurality of semiconductor wafers sealed within the moisture barrier bag.

* * * * *

UNITED STATES PATENT AND TRADEMARK OFFICE
CERTIFICATE OF CORRECTION

PATENT NO. : 6,026,963
DATED : February 22, 2000
INVENTOR(S) : Aaron Leo Gray, III and Elizabeth C. Cooke It is certified that error appears in the above-identified patent and that said Letters Patent is hereby corrected as shown below:

In Column 6, Claim 7, line 5 please change "said opacue" to read -- said opaque --.

Signed and Sealed this

Tenth Day of April, 2001

*Attest:*

NICHOLAS P. GODICI

*Attesting Officer*   Acting Director of the United States Patent and Trademark Office